(12) United States Patent
Kong (10) Patent No.: US 10,643,013 B2
(45) Date of Patent: May 5, 2020

(54) TIE-HIGH AND TIE-LOW CIRCUITS

(71) Applicant: MagnaChip Semiconductor, Ltd., Cheongju-si (KR)

(72) Inventor: Wan Chul Kong, Gyeonggi-do (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 3 days.

(21) Appl. No.: 15/985,007

(22) Filed: May 21, 2018

(65) Prior Publication Data
US 2019/0012419 A1   Jan. 10, 2019

(30) Foreign Application Priority Data
Jul. 6, 2017   (KR) .......................... 10-2017-0085900

(51) Int. Cl.
*G06F 30/39* (2020.01)
*H03K 19/20* (2006.01)
*H01L 27/02* (2006.01)
*H01L 27/118* (2006.01)

(52) U.S. Cl.
CPC .......... *G06F 30/39* (2020.01); *H01L 27/0251* (2013.01); *H01L 27/0266* (2013.01); *H01L 27/0288* (2013.01); *H01L 27/11807* (2013.01); *H03K 19/20* (2013.01)

(58) Field of Classification Search
CPC .................................................. G06F 17/5068
USPC ......................................................... 716/139
See application file for complete search history.

(56) References Cited

U.S. PATENT DOCUMENTS

| 5,264,723 | A | * | 11/1993 | Strauss | H01L 27/0251 257/297 |
|---|---|---|---|---|---|
| 5,631,492 | A | * | 5/1997 | Ramus | H01L 27/0207 257/401 |
| 7,638,821 | B2 | * | 12/2009 | Aoki | H01L 27/0207 257/204 |
| 7,705,654 | B2 | * | 4/2010 | Rong | H03K 19/0963 327/376 |

(Continued)

FOREIGN PATENT DOCUMENTS

JP   2004-342924 A   12/2004

OTHER PUBLICATIONS

Korean Office Action dated Dec. 24, 2019 in coutnerpart Korean Patent Application No. 10-2017-0085900 (4 pages in Korean).

*Primary Examiner* — Suresh Memula
(74) *Attorney, Agent, or Firm* — NSIP Law (57) ABSTRACT

A tie-high circuit includes: a p-type metal-oxide-semiconductor (PMOS) transistor connected to a power rail in a standard cell library; and a decoupling capacitor connected to a ground rail in the standard cell library and the PMOS transistor. The decoupling capacitor includes an n-type metal-oxide-semiconductor (NMOS) transistor having either one of a source and a drain of the NMOS transistor being connected to the ground rail via an active resistor. A tie-low circuit includes: an n-type metal-oxide-semiconductor (NMOS) transistor connected to a ground rail in a standard cell library; and a decoupling capacitor connected to a power rail in the standard cell library and the NMOS transistor. The decoupling capacitor of the tie-low circuit includes a PMOS transistor having either one of a source and a drain of the PMOS transistor being connected to the power rail via an active resistor.

16 Claims, 6 Drawing Sheets

(56) References Cited

U.S. PATENT DOCUMENTS

| | | | |
|---|---|---|---|
| 7,705,666 B1* | 4/2010 | Hsu | H03K 19/20 |
| | | | 327/551 |
| 7,949,988 B2 | 5/2011 | Tsai et al. | |
| 8,446,176 B1* | 5/2013 | Yang | G06F 17/5068 |
| | | | 257/401 |
| 8,884,338 B2* | 11/2014 | Kim | G11C 5/063 |
| | | | 257/202 |
| 9,634,026 B1* | 4/2017 | Sahu | H01L 27/11807 |
| 2004/0228066 A1* | 11/2004 | Sakurabayashi | H01L 27/0207 |
| | | | 361/302 |
| 2009/0249273 A1* | 10/2009 | Tsai | G06F 17/5068 |
| | | | 716/119 |
| 2017/0229457 A1* | 8/2017 | Maeno | H01L 27/092 |
| 2017/0352651 A1* | 12/2017 | Kumar | H01L 27/0251 |
| 2019/0081038 A1* | 3/2019 | Kong | H01L 27/0288 |
| 2019/0103394 A1* | 4/2019 | Andrews | H01L 23/373 |

* cited by examiner

TIE-HIGH AND TIE-LOW CIRCUITS

CROSS-REFERENCE TO RELATED APPLICATIONS

This application claims the benefit under 35 USC 119(a) of Korean Patent Application No. 10-2017-0085900 filed on Jul. 6, 2017 in the Korean Intellectual Property Office, the entire disclosure of which is incorporated herein by reference for all purposes.

BACKGROUND

1. Field

The following description relates to tie-high and tie-low circuits. More particularly, the following description relates to tie-high and tie-low circuits capable of functioning as a decoupling capacitor.

2. Description of Related Art

A first step to designing an application specific Integrated circuit (ASIC) chip is to describe logic functions of the circuit to be implemented in the chip in a VHSIC hardware description language (VHDL) or a Verilog, which is a hardware description language. The code described in this language is subjected to a process called logic synthesis, which is mapped to a combination of standard cells performing basic logic functions. It may be necessary to fix an input of the standard cell to high or low due to a logic function. In this case, when a power node or a ground node is directly connected to an input of a gate of the standard cell via a metal, the input of the gate of the standard cell becomes vulnerable to an electrostatic discharge (ESD) signal. Thus, in order to compensate for this, a method of protecting the input of the gate of the standard cell is widely used by using tie-high/tie-low (TIEHI/TIELO) cells corresponding to cells whose an output signal is designed to have a power voltage level or a ground voltage level. These cells are generally implemented in a structure that combines a structure having a pair of pull-up/down PMOS/NMOS transistors with an additional circuit. Thus, there is a disadvantage that the structure is complicated and the size becomes large.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a tie-high circuit includes: a p-type metal-oxide-semiconductor (PMOS) transistor connected to a power rail in a standard cell library; and a decoupling capacitor connected to a ground rail in the standard cell library and the PMOS transistor wherein the decoupling capacitor comprises an n-type metal-oxide-semiconductor (NMOS) transistor having a source and a drain, either one of the source and the drain of the NMOS transistor being connected to the ground rail via an active resistor.

The either one of the source and the drain of the NMOS transistor may be connected to a gate of the PMOS transistor.

A gate of the NMOS transistor may be connected to a drain of the PMOS transistor, and an output of the tie-high circuit may be provided at the drain of the PMOS transistor.

A source of the PMOS transistor may be connected to the power rail.

In response to a supply voltage (VDD) being applied to the power rail, the supply voltage (VDD) may be divided according to a ratio of an on resistance of the PMOS transistor to an effective resistance of the NMOS transistor so that the output of the tie-high circuit is provided at the drain of the PMOS transistor.

In another general aspect, a tie-low circuit includes: an n-type metal-oxide-semiconductor (NMOS) transistor connected to a ground rail in a standard cell library; and a decoupling capacitor connected to a power rail in the standard cell library and the NMOS transistor, wherein the decoupling capacitor comprises a p-type metal-oxide-semiconductor (PMOS) transistor having a source and a drain, either one of the source and the drain of the PMOS transistor being connected to the power rail via an active resistor.

The either one of the source and the drain of the PMOS transistor may be connected to a gate of the NMOS transistor.

A gate of the PMOS transistor may be connected to a drain of the NMOS transistor, and an output of the tie-low circuit may be provided at the drain of the NMOS transistor.

A source of the NMOS transistor may be connected to the ground rail.

In response to a supply voltage (VDD) being applied to the power rail, the supply voltage (VDD) may be divided according to a ratio of an effective resistance of the PMOS transistor to an on resistance of the NMOS transistor so that the output of the tie-low circuit is provided at the drain of the NMOS transistor.

According to the disclosed embodiments of the tie-high/tie-low circuits, there is a technical effect that the structure can be simplified and an increased decoupling capacitance can be obtained.

In another general aspect, a tie-high circuit in a standard cell includes a first transistor and a decoupling capacitor. The first transistor is connected to a power rail. The decoupling capacitor is connected to a ground rail and the first transistor, and includes a second transistor having either one of a source and a drain of the second transistor being connected to the ground rail via an active resistor.

The first transistor may be a p-type metal-oxide-semiconductor (PMOS) transistor and the second transistor may be an n-type metal-oxide-semiconductor (NMOS) transistor.

Either one of the source and the drain of the NMOS transistor may be connected to a gate of the PMOS transistor.

A gate of the NMOS transistor may be connected to a drain of the PMOS transistor, and an output of the tie-high circuit may be provided at the drain of the PMOS transistor.

A source of the PMOS transistor may be connected to the power rail.

In response to a supply voltage (VDD) being applied to the power rail, the VDD may be divided according to a ratio of an on resistance of the PMOS transistor to an effective resistance of the NMOS transistor so that the output of the tie-high circuit is provided at the drain of the PMOS transistor.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Embodiments disclosed herein are directed to tie-high and tie-low circuits capable of functioning as a decoupling capacitor. Embodiments of the disclosed tie-high circuit have a simplified structure in which a PMOS transistor used for the pull-up purpose is connected to a MOS capacitor. Embodiments of the disclosed tie-low circuit have a simplified structure in which an NMOS transistor used for the pull-down purpose is connected to a MOS capacitor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Embodiments will be described in more detail below with reference to the appended drawings.

Figure 1:
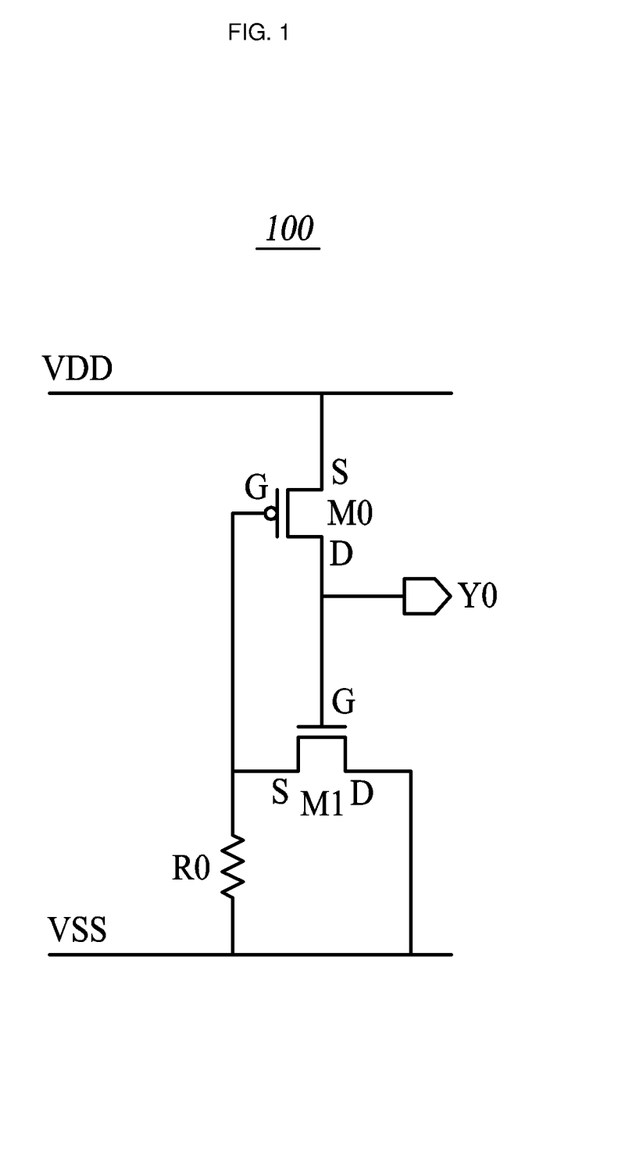
FIG. 1 is a view illustrating a structure of a tie-high circuit according to an embodiment.

FIG. 1 is a view illustrating a structure of a tie-high circuit according to an embodiment.

A tie-high circuit 100 according to an embodiment may be disposed adjacent to standard cells that need to fix the input high in a standard cell library. As illustrated in FIG. 1, the tie-high circuit 100 includes a p-type metal-oxide-semiconductor (PMOS) transistor M0 that performs a pull-up function and an n-type metal-oxide-semiconductor (NMOS) transistor M1 that serves as a decoupling capacitor. A source of the PMOS transistor M0 is connected to a power rail to which a supply voltage VDD is applied in the standard cell library, and a drain of the PMOS transistor M0 is connected to an output terminal Y0. In the illustrated embodiment, a drain of the NMOS transistor M1 is connected to a ground rail to which a ground voltage VSS is applied in the standard cell library, and a source of the NMOS transistor M1 is connected to a gate of the PMOS transistor M0 as well as the ground rail via an active resistor R0. In another embodiment, the source of the NMOS transistor M1 may be connected to the ground rail, and the drain of the NMOS transistor M1 may connected to the gate of the PMOS transistor M0 as well as the ground rail via the active resistor R0. The gate of the NMOS transistor M1 may be connected to the drain of the PMOS transistor M0.

An output terminal Y0 of the tie-high circuit 100 has a ground potential in a state that a power voltage is not applied. In response to the supply voltage being applied to the power rail, a voltage to the tie-high circuit 100 is ramped up, and a voltage difference occurs between the gate and the source of the PMOS transistor M0. As the voltage difference exceeds a threshold voltage Vth, the PMOS transistor M0 is turned on so that an output signal having substantially the same magnitude as the supply voltage VDD is output via the output terminal Y0. Since the gate of the NMOS transistor M1 is connected to the drain of the PMOS transistor M0, that is, the output terminal Y0, the NMOS transistor M1 is also turned on so that the NMOS transistor M1 operates as a MOS capacitor. Since the gate of the PMOS transistor M0 is connected to the ground rail via the active resistor R0 connected to the source of the NMOS transistor M1, the input resistance of the gate of the PMOS transistor M0 can be increased. Thus, the gate of the PMOS transistor M0 can be protected from an electrostatic discharge (ESD) signal that may be caused from the ground rail. In an embodiment, the active resistor R0 provided by an active region may have a resistance value of about 30-40 times a resistance value of a metal. When other decoupling capacitors are disposed in a chip, a capacitance between the supply voltage and the ground can be increased, thereby enhancing the noise reduction effect in a supply node. Since the NMOS transistor M1 operates as the MOS capacitor, a leakage current of about several pA flows through the NMOS transistor M1. Thus, the supply voltage VDD is divided according to a ratio of an on resistance Ron of the PMOS transistor M0 to an effective resistance Reff of the NMOS transistor M1 so that the supply voltage VDD is provided as an output signal in the output terminal Y0. Since the effective resistance Reff of the NMOS transistor M1 is considerably larger than the on resistance Ron of the PMOS transistor M0, a voltage having substantially the same magnitude as the supply voltage VDD is applied via the output terminal Y0.

Figure 2:
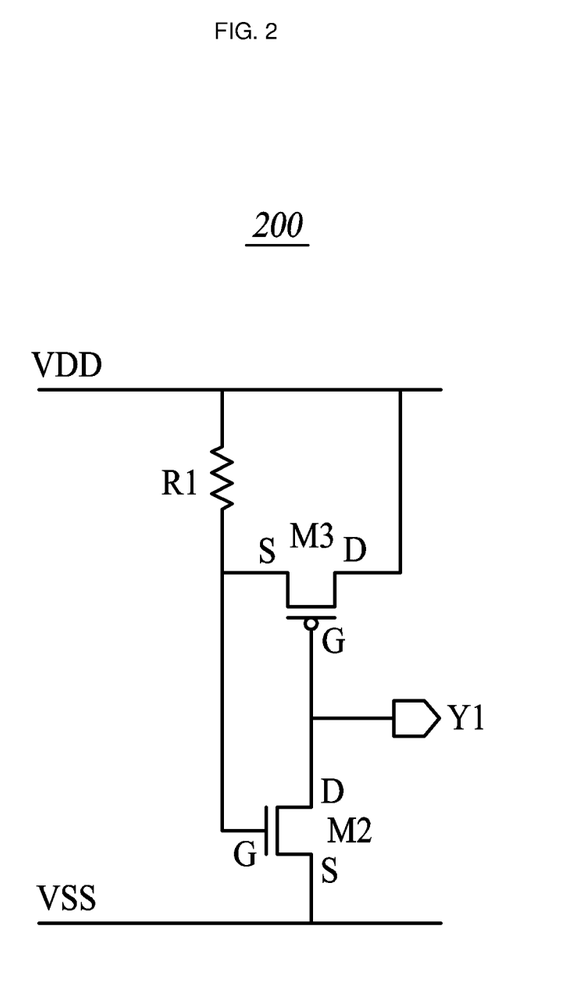
FIG. 2 is a view illustrating a structure of a tie-low circuit according to an embodiment.

FIG. 2 is a view illustrating a structure of a tie-low circuit according to an embodiment.

A tie-low circuit 200 according to an embodiment may be disposed adjacent to standard cells that need to hold an input low in the standard cell library. As illustrated in FIG. 2, the tie-low circuit 200 includes an NMOS transistor M2 that performs a pull-down function and a PMOS transistor M3 that serves as the decoupling capacitor. A source of the NMOS transistor M2 is connected to the ground rail, and a drain of the NMOS transistor M2 is connected to an output terminal Y1. In the illustrated embodiment, a drain of the PMOS transistor M3 is connected to the power rail, and a source of the PMOS transistor M3 is connected to a gate of the NMOS transistor M2 as well as the power rail via an active resistor R1. In another embodiment, the source of the PMOS transistor M3 may connected to the power rail, and the drain of PMOS transistor M3 may be connected to the gate of the NMOS transistor M2 as well as the power rail via the active resistor R1. A gate of the PMOS transistor M3 may be connected to the drain of the NMOS transistor M2.

The output terminal Y1 of the tie-low circuit 200 has a ground potential in a state that the initial power is not applied. In response to the supply voltage VDD being applied to the power rail, a voltage to the tie-low circuit 200 is ramped up, and a voltage difference occurs between the gate and the source of the NMOS transistor M2. As the voltage difference exceeds the threshold voltage Vth, the NMOS transistor M2 is turned on so that an output signal having substantially the same magnitude as the ground voltage VSS is output via the output terminal Y1. Since the gate of the PMOS transistor M3 is connected to the drain of the NMOS transistor M2, that is, the output terminal Y1, the PMOS transistor M3 is also turned on so that the PMOS transistor M3 operates as the MOS capacitor. Since the gate of the NMOS transistor M2 is connected to the power rail via the active resistor R1 connected to the source of the PMOS transistor M3, an input resistance of the gate of the NMOS transistor M2 can be increased. Thus, the gate of the NMOS transistor M2 can be protected from the ESD signal. In an embodiment, the active resistor R1 provided by the active region may have a resistance value of about 30-40 times the resistance value of the metal. When other decoupling capacitors are disposed in the chip, the capacitance between the supply voltage VDD and the ground can be increased, thereby enhancing the noise reduction effect in the supply node. Since the PMOS transistor M3 operates as the MOS capacitor, a leakage current of about several pA flows through the PMOS transistor M3. Thus, the supply voltage VDD is divided according to a ratio of an effective resistance Reff of the PMOS transistor M3 to an on resistance Ron of the NMOS transistor M2 so that the supply voltage VDD is provided as an output signal in the output terminal Y1. Since the effective resistance Reff of the PMOS transistor M3 is considerably larger than the on resistance Ron of the NMOS transistor M2, a voltage having substantially the same magnitude as the ground voltage VSS is applied via the output terminal Y1.

Figure 3A:
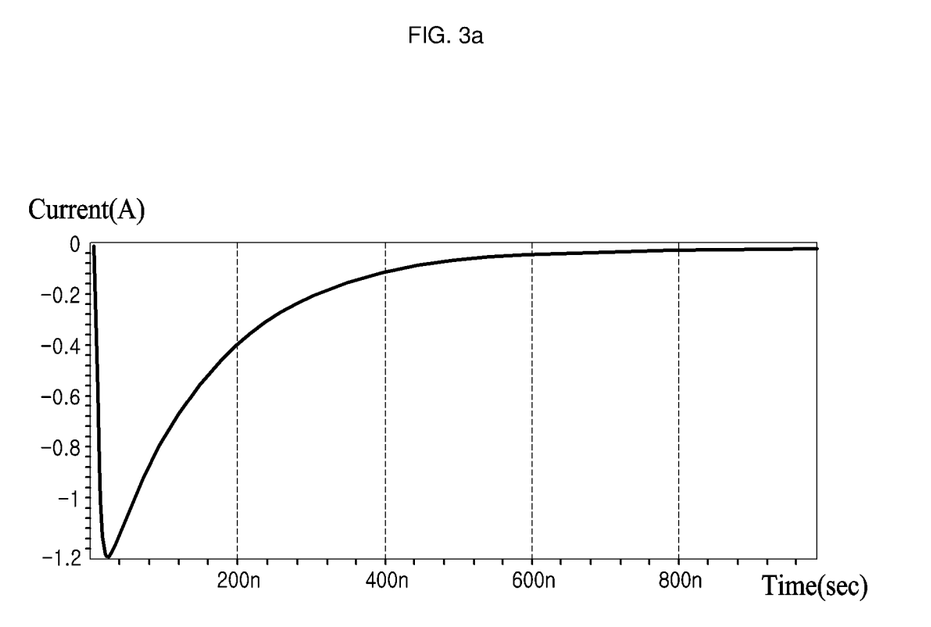
FIG. 3A is a view illustrating an embodiment of a waveform of an electrostatic discharge (ESD) signal.
Figure 3B:
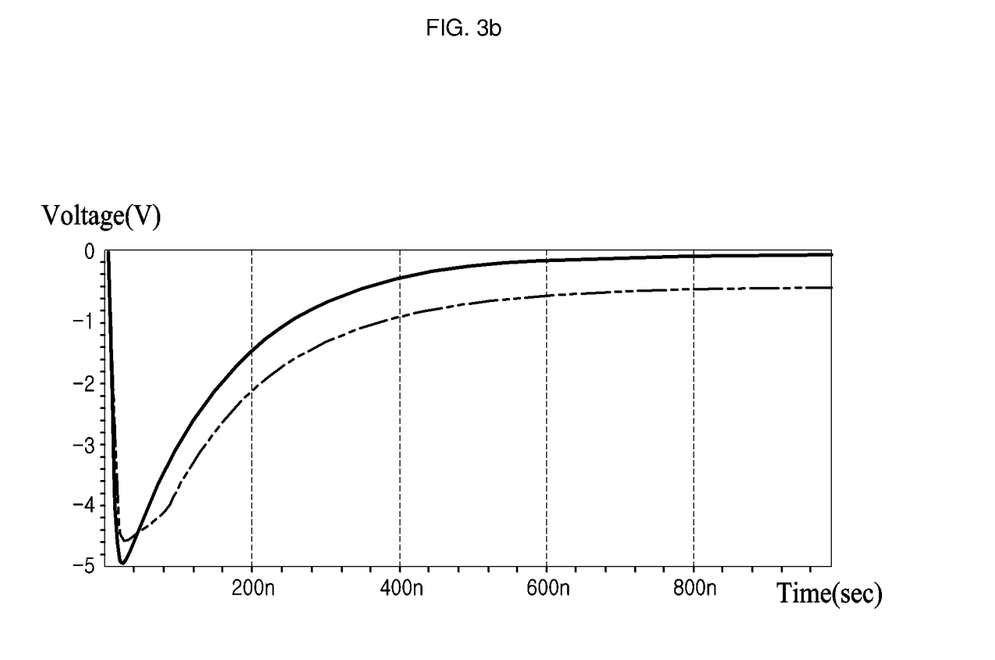
FIG. 3B is a view illustrating a result of performing an ESD simulation on the tie-high circuit according to an embodiment and a conventional tie-high circuit, where the conventional tie-high circuit is structured such that a source of an NMOS transistor is connected to a ground rail and a gate and drain of the NMOS transistor are connected to a gate of a PMOS transistor whose source is connected to a power rail and whose drain provides an output signal.

FIG. 3A is a view illustrating an embodiment of a waveform of the ESD signal. FIG. 3B is a view illustrating a result of performing an ESD simulation on the tie-high circuit according to an embodiment and a conventional tie-high circuit, where the conventional tie-high circuit is structured such that a source of an NMOS transistor is connected to a ground rail and a gate and drain of the NMOS transistor are connected to a gate of a PMOS transistor whose source is connected to a power rail and whose drain provides an output signal.

FIG. 3B shows a waveform of a voltage which is inputted to the gate of the PMOS transistor M0 when the ESD signal shown in FIG. 3A flows into the tie-high circuit 100 according to an embodiment via the ground rail, and a waveform of a voltage which is inputted to the gate of the PMOS transistor when the ESD signal shown in FIG. 3A flows into the conventional tie-high circuit via the ground rail, as a solid line and a dotted line, respectively. According to the simulation result, in the case of the tie-high circuit 100 according to an embodiment, as illustrated in the figure, when the ESD signal has a value of about −1.2 A, the voltage inputted to the gate of the PMOS transistor M0 has a magnitude of about −5 V, but is gradually discharged over time and becomes close or asymptotic to a magnitude of about 0V. In the case of the conventional tie-high circuit, when the ESD signal has a value of about −1.2 A, the voltage inputted to the gate of the PMOS transistor is about −4.6 V, but is gradually discharged over time and becomes close to a magnitude of about −0.6 V. Comparing the two waveforms, it can be seen that the voltage inputted to the gate of the PMOS transistor M0 of the tie-high circuit 100 according to an embodiment has a magnitude of about 85% smaller than the voltage inputted to the gate of the PMOS transistor of the conventional tie-high circuit with respect to the absolute value.

Figure 4A:
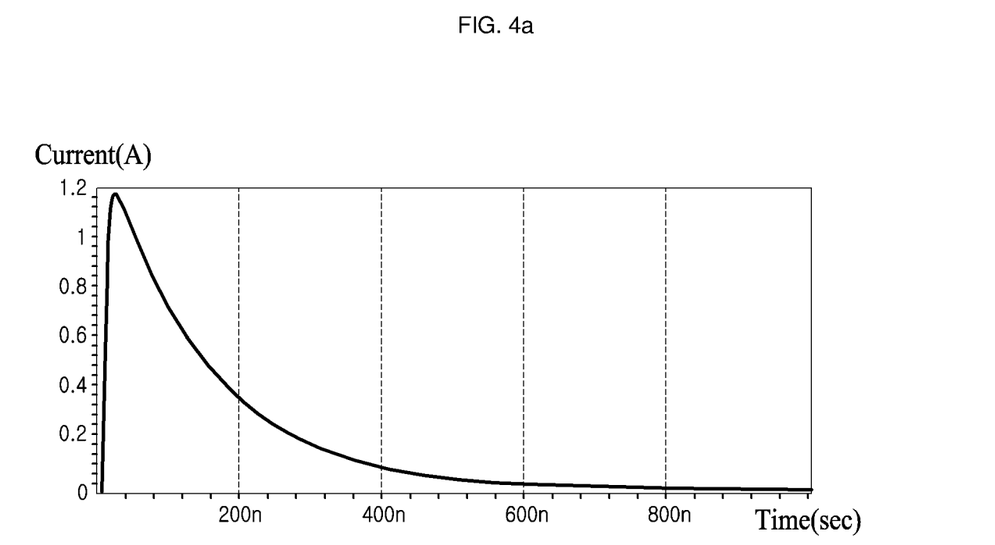
FIG. 4A is a view illustrating a waveform of the ESD signal according to another embodiment.
Figure 4B:
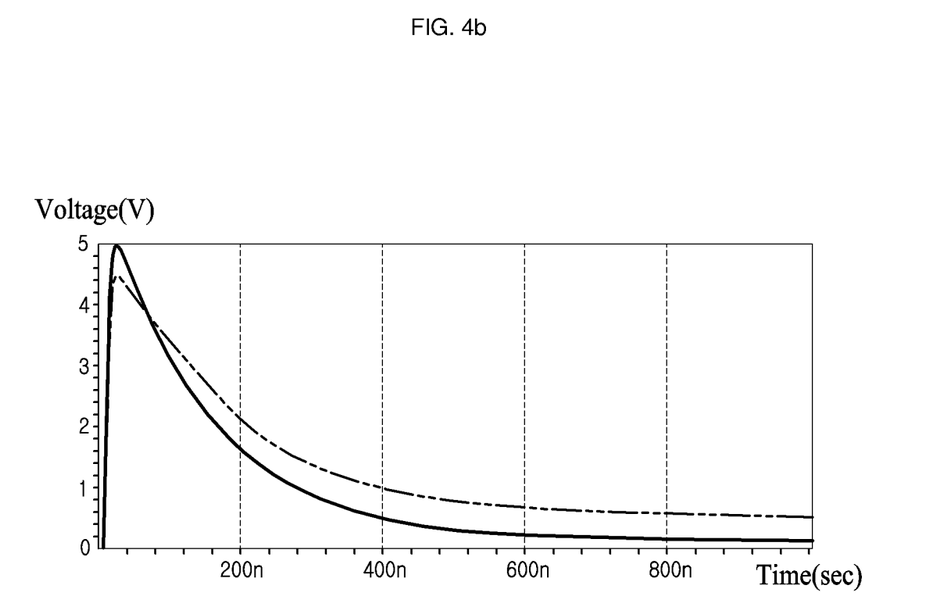
FIG. 4B is a view illustrating a result of performing the ESD simulation on the tie-low circuit according to an embodiment and a conventional tie-low circuit, where the conventional tie-low circuit is structured such that a source of a PMOS transistor is connected to a power rail and a gate and drain of the PMOS transistor are connected to a gate of an NMOS transistor whose source is connected to a power rail and whose drain provides an output signal.

FIG. 4A is a view illustrating a waveform of the ESD signal according to another embodiment. FIG. 4B is a view illustrating a result of performing the ESD simulation on the tie-low circuit according to an embodiment and a conventional tie-low circuit, where the conventional tie-low circuit is structured such that a source of a PMOS transistor is connected to a power rail and a gate and drain of the PMOS transistor are connected to a gate of an NMOS transistor whose source is connected to a power rail and whose drain provides an output signal.

FIG. 4B shows a waveform of a voltage which is inputted to the gate of the NMOS transistor M2 when the ESD signal shown in FIG. 4A flows into the tie-low circuit 200 according to an embodiment via the power rail, and a waveform of a voltage which is inputted to the gate of the NMOS transistor when the ESD signal shown in FIG. 4A flows into the conventional tie-low circuit via the power rail, as a solid line and a dotted line, respectively. According to the simulation result, in the case of the tie-low circuit 200 according to an embodiment, as illustrated in the figure, when the ESD signal has a peak value of about 1.2 A, the voltage inputted to the gate of the NMOS transistor M2 has a magnitude of about 5 V, but is gradually discharged over time and becomes close or asymptotic to a magnitude of about 0V. In the case of the conventional tie-low circuit, when the ESD signal has a peak value of about 1.2 A, the voltage inputted to the gate of the NMOS transistor has about 4.6 V, but is gradually discharged over time and becomes close to a magnitude of about 0.6 V. Comparing the two waveforms, it can be seen that the voltage inputted to the gate of the NMOS transistor M2 of the tie-low circuit 200 according to an embodiment has a magnitude of about 84% smaller than the voltage inputted to the gate of the NMOS transistor of the conventional tie-low circuit with respect to the absolute value.

In the embodiments disclosed herein, the arrangement of the illustrated components may vary depending on an environment or requirements to be implemented. For example, some of the components may be omitted or several components may be integrated and implemented together. In addition, the arrangement order of some of the components can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A tie-high circuit, comprising:
a p-type metal-oxide-semiconductor (PMOS) transistor connected to a power rail in a standard cell library; and
a decoupling capacitor connected to a ground rail in the standard cell library and the PMOS transistor, and comprising an n-type metal-oxide-semiconductor (NMOS) transistor having either one of a source and a drain of the NMOS transistor connected to the ground rail via an active resistor and the other one of the source and the drain of the NMOS transistor connected to the ground rail.

2. The circuit of claim 1, wherein the either one of the source and the drain of the NMOS transistor is connected to a gate of the PMOS transistor.

3. The circuit of claim 2, wherein a gate of the NMOS transistor is connected to a drain of the PMOS transistor, and an output of the tie-high circuit is provided at the drain of the PMOS transistor.

4. The circuit of claim 3, wherein a source of the PMOS transistor is connected to the power rail.

5. The circuit of claim 4, wherein in response to a supply voltage (VDD) being applied to the power rail, the VDD is divided according to a ratio of an on resistance of the PMOS transistor to an effective resistance of the NMOS transistor so that the output of the tie-high circuit is provided at the drain of the PMOS transistor.

6. A tie-low circuit, comprising:
an n-type metal-oxide-semiconductor (NMOS) transistor connected to a ground rail in a standard cell library; and
a decoupling capacitor connected to a power rail in the standard cell library and the NMOS transistor, and comprising a p-type metal-oxide-semiconductor (PMOS) transistor having either one of a source and a drain of the PMOS transistor being connected to the power rail via an active resistor and the other one of the source and the drain of the PMOS transistor connected to the power rail.

7. The circuit of claim 6, wherein the either one of the source and the drain of the PMOS transistor is connected to a gate of the NMOS transistor.

8. The circuit of claim 7, wherein a gate of the PMOS transistor is connected to a drain of the NMOS transistor, and an output of the tie-low circuit is provided at the drain of the NMOS transistor.

9. The circuit of claim 8, wherein a source of the NMOS transistor is connected to the ground rail.

10. The circuit of claim 9, wherein in response to a supply voltage (VDD) being applied to the power rail, the VDD is divided according to a ratio of an effective resistance of the PMOS transistor to an on resistance of the NMOS transistor so that the output of the tie-low circuit is provided at the drain of the NMOS transistor.

11. A tie-high circuit in a standard cell, comprising:
a first transistor connected to a power rail; and
a decoupling capacitor connected to a ground rail and the first transistor, and comprising a second transistor having either one of a source and a drain of the second transistor connected to the ground rail via an active resistor and the other one of the source and the drain of the second transistor connected to the ground rail.

12. The circuit of claim 11, wherein the first transistor is a p-type metal-oxide-semiconductor (PMOS) transistor and the second transistor is an n-type metal-oxide-semiconductor (NMOS) transistor.

13. The circuit of claim 12, wherein the either one of the source and the drain of the NMOS transistor is connected to a gate of the PMOS transistor.

14. The circuit of claim 13, wherein a gate of the NMOS transistor is connected to a drain of the PMOS transistor, and an output of the tie-high circuit is provided at the drain of the PMOS transistor.

15. The circuit of claim 14, wherein a source of the PMOS transistor is connected to the power rail.

16. The circuit of claim 15, wherein, in response to a supply voltage (VDD) being applied to the power rail, the VDD is divided according to a ratio of an on resistance of the PMOS transistor to an effective resistance of the NMOS transistor so that the output of the tie-high circuit is provided at the drain of the PMOS transistor.

* * * * *